United States Patent [19]

Bachmann et al.

[11] 4,121,238

[45] Oct. 17, 1978

[54] METAL OXIDE/INDIUM PHOSPHIDE DEVICES

[75] Inventors: Klaus Jurgen Bachmann, Piscataway; Paul Herman Schmidt, Chatham; Edward Guerrant Spencer, Murray Hill; Karnamadakala Sreenivasaacharlu Sree Harsha, North Plainfield, all of N.J.

[73] Assignee: Bell Telephone Laboratories, Incorporated, Murray Hill, N.J.

[21] Appl. No.: 769,107

[22] Filed: Feb. 16, 1977

[51] Int. Cl.$^2$ .............................................. H01L 27/14
[52] U.S. Cl. .......................................... 357/16; 357/4; 357/30; 357/17; 357/52; 357/59
[58] Field of Search ................... 357/16, 4, 30, 17, 59, 357/52

[56] References Cited

U.S. PATENT DOCUMENTS

| 3,539,883 | 11/1970 | Harrison | 317/234 |
|---|---|---|---|
| 3,560,812 | 2/1971 | Hall | 317/234 |
| 3,614,549 | 10/1971 | Lorenz | 317/234 |
| 3,978,510 | 8/1976 | Kasper | 357/30 |
| 4,016,586 | 4/1977 | Anderson | 357/2 |
| 4,024,558 | 5/1977 | Merrin | 357/2 |

OTHER PUBLICATIONS

Hovel et al., I.B.M. Tech. Discl. Bull., vol. 18, No. 5, Oct. 1975, p. 1575.
Dubow et al., Appl. Phys. Lett., vol. 29, No. 8, 15 Oct. 1976.

*Primary Examiner*—Martin H. Edlow
*Attorney, Agent, or Firm*—George S. Indig; Bruce S. Schneider

[57] ABSTRACT

Devices using a transparent conductive layer of indium oxide or indium tin oxide, and a layer of a direct gap semiconductor material have been found to operate as solar cells and as light emitting devices. Exemplary of such devices is an indium tin oxide/p-InP cell which shows a 12.5% solar power conversion efficiency and also emits a red colored light when biased.

10 Claims, No Drawings

METAL OXIDE/INDIUM PHOSPHIDE DEVICES

BACKGROUND OF THE INVENTION

1. Field of the Invention

The invention relates to semiconductor devices useful, for example, for converting electromagnetic radiation into electrical energy, as in solar cells, or for converting electrical energy into electromagnetic radiation as in light emitting devices.

2. Description of the Prior Art

Devices made by the interface of a wide bandgap window region and a narrower bandgap active region are being explored for solar cell and light emitting applications. Such devices formed by the interface of a transparent highly conductive layer (conductivity greater than $10^2 \Omega^{-1} cm^{-1}$) and a direct gap semiconductor layer have inherent advantages in applications such as solar power conversion. The electrical contacts made to either the window or active region of a heterojunction device often have high resistances which limit obtainable solar power conversion efficiency. The use of a window region with high conductivity eliminates problems often associated with making a low resistance, nonrectifying front contact. A second important attribute of highly conductive materials is that they are often deposited by methods adaptable to commercial production processes. For example, indium tin oxide has been deposited in a variety of ways. (For a few illustrations see Fraser, D. B., *Proceedings of IEEE*, 61, 1013–1018, (1973) sputtering; Groth, R. and Kaver, E., *Phillips Technical Review*, 26, 105, (1965) pyrolysis; and Kawe, J. et al, *Thin Solid Films*, 29, 155–163 (1975) chemical vapor deposition.)

Despite the advantages of using a highly conducting window layer, there are often counter balancing disadvantages. For example, the interface of a highly conducting layer with a less conductive semiconductor usually forms a Schottky-type barrier. Such barrier devices often have lower efficiencies than those obtained with typical heterojunction semiconductor devices. The difficulty of fabricating a thin film polycrystalline device, i.e., a device with a polycrystalline active semiconductor region, having a highly conducting window region is also a significant problem. The window must be thin enough to transmit a substantial percentage, e.g., at least 50% of the incident solar energy. For highly conductive materials such as metals, this requirement often dictates a window layer thickness less than 150 Angstroms. However, when such thin layers are deposited on the relatively irregular surface of the thin polycrystalline active semiconductor layer, a continuous coating is usually not obtainable. These coating discontinuities make preparation of useful polycrystalline thin film devices with highly conductive window regions impractical.

Therefore a device having a highly conducting window region and a single crystal active region with an acceptable power conversion efficiency is a desirable entity. Such a device is particularly advantageous if the polycrystalline embodiment, i.e., the device with a highly conducting window region and a polycrystalline active semiconductor region, is operative.

SUMMARY OF THE INVENTION

It has been found that a device made from a single crystal region of p-type indium phosphide contacted with a transparent, highly conductive region of a metal oxide formed from indium oxide, or an indium tin oxide composition, yields a power conversion efficiency of up to about 12.5%. The corresponding device with a thin film polycrystalline layer of InP is also operative and has a solar conversion efficiency of about 2% with antireflection coating. The devices of the invention have been made by conventional techniques such as sputter deposition which has been used for commercial production of electronic devices. The inventive devices have inherent important advantages associated with their genre without the usual disadvantages.

DETAILED DESCRIPTION

Various crystalline forms of indium phosphide are useful for the inventive devices. These forms include, for example, a single crystal of InP, a polycrystalline indium phosphide wafer, a thin film polycrystalline layer of indium phosphide deposited on a supporting substrate, and an epitaxial layer of single crystal InP on a supporting substrate. It is possible to make each of the exemplary forms by known techniques. For example, these crystalline forms are prepared respectively by a liquid encapsulated Czochralski-pulling technique, a gradient freeze method, a $H_2/HCl$ transport chemical vapor deposition (CVD) process, and a liquid phase epitaxy (LPE) process. The carrier concentration of the InP material is not critical. Typically, majority carrier concentrations in the range between about $10^{16} cm^{-3}$ and $10^{19} cm^{-3}$ are acceptable. The thickness of the InP layer varies with the particular embodiment. Excessively thick layers cause undue material waste. However, the InP should be thick enough to prevent the occurrence of high-sheet resistances and excessive transmission losses. Within these limits restrictions are sometimes imposed by the fabrication process itself e.g., it is inconvenient to cut single crystal wafers thinner than 0.2 mm. Typically, single crystal wafers in the range of about 0.3 to 0.5 mm thick, polycrystalline wafers in the range of about 0.3 mm to 0.5 mm, thin polycrystalline films in the range of about 5 $\mu$m to 50 $\mu$m and single crystal epitaxial layers in the range of about 2 $\mu$m to 20 $\mu$m are advantageous but as indicated above other values may be desirable in other circumstances.

In most cases electrical contact is made to one of the major surfaces of the indium phosphide region before the metal oxide window is deposited on the opposite side of the InP. This is a precautionary measure since many of the common contact materials, e.g., a Au/Zn alloy must be sintered at relatively high temperatures (~400° C) which introduces the possibility of degradation of the metal oxide. The surface of the InP layer upon which the window region is to be deposited is also generally cleaned before deposition of the window to prevent undue contamination at the interface. Conventional methods of cleaning are employed such as treatment with appropriate solvents.

The metallic oxide layer is deposited on the InP region by techniques such as ion beam sputter deposition or RF sputtering. At temperatures $\gtrsim$ 500° C in vacuum, the surface of the InP is degraded. Ion beam sputter deposition techniques are advantageous because during deposition it is possible to keep the InP at temperatures substantially below this degradation limit. When the InP is kept at room temperature during ion beam deposition, an amorphous (no discernible X-ray diffraction peaks) metallic oxide layer is formed. At elevated temperatures, e.g., around 250° C, a polycrystalline film is formed. The exact temperature at which the transition from amorphous to polycrystalline occurs, may be readily determined for the particular conditions of operation. The crystalline nature affects the electrical properties of the device. For example, devices made by $Ar^+$ ion beam sputter deposition, which have polycrystalline metal oxide layers, are generally observed to have better sheet resistance and higher fill factors than the corresponding amorphous layer.

Materials useful as the metal oxide are indium oxide, or an indium tin oxide composition. These indium tin oxide compositions are chemical combinations of the oxides of indium and tin. Such compositions are defined by the percentage of indium oxide and tin oxide which accounts for the quantitative make up of the composition. The use of such quantitative terms however, is not to suggest that indium oxide and tin oxide exist as separate entities in the composition.

The efficiency of the device depends on the particular composition of the metal oxide window layers. The conversion efficiencies of devices made with an indium tin oxide layer having an indium oxide content less than 20 mole % (greater than 80 mole % tin oxide) are not generally advantageous. Preferably, devices are made with indium tin oxide layers having an indium oxide content of at least 50 mole %. It is most advantageous that the inventive devices have an indium tin oxide layer with an indium oxide content of at least 80 mole %. For example, an indium oxide coating on a single crystal InP region deposited by ion beam sputter deposition tested under simulated conditions made by irradiating with a tungsten/halogen lamp through a Schott Kg1 filter (designated AM2 conditions) showed a power conversion efficiency of about 7.6%. In a preferred embodiment when a 90% indium oxide 10% tin oxide target was used for $AR^+$ ion beam sputter deposition on the (100) surface of a single crystal of indium phosphide held at room temperature, a conversion efficiency of 12.5% under simulated AM2 conditions was measured. The device also emitted in the visible when a bias was applied. (The indium and tin oxide content of the amorphous indium tin oxide layer thus produced was determined by x-ray fluorescence and within experimental error was the same as the sputtering target.)

To obtain reasonable efficiencies when the device is operated as a solar cell, it is desirable that the final metal oxide layer has a sheet resistance below about 100Ω/□ and an optical transmittance to sunlight of at least 60%. Both sheet resistance and transmittance vary with layer thickness. Generally, metallic oxide layers between about 1000 Angstroms and 5 $\mu$m thick satisfy the above requirements for layers with resistivity in the area of $10^{-3}$ ohm-cm. The transmittance and conductivity properties of indium oxide films have been published. (See Fraser, D. B., *Journal Electrochemical Society*, 119, 1368, (1972).) Such data may be used as a guide in determining the appropriate layer thickness. If the device is to be used as a light emitter by applying a voltage, the requirements are less strict and depend on the ultimate application.

Electrical contact to the metallic oxide layer is made by conventional methods such as by thermally evaporating metal strips such as aluminum on one side of the exposed surface. The particular contact method is not at all critical. This noncriticality is indeed one of the advantages of the subject devices.

The following examples are illustrative of various aspects of the invention and demonstrate the conditions used to fabricate typical embodiments of the invention.

EXAMPLE 1

A zinc doped crystal of InP with a carrier concentration of approximately $10^{17} cm^{-3}$ was made by the Czochralski-pulling technique. The crystal was then oriented parallel to the 100 plane by the Laue x-ray method. A reference cut was made with a string saw parallel to this plane. Wafers of approximately 0.6 mm thickness were obtained by cutting parallel to the reference face with a diamond saw. The wafers were lapped with a 0.3 $\mu$m abrasive and then Syton polished. (Syton is an alkaline collodial suspension of $SiO_2$ useful as a polishing agent.) The wafer thickness after this treatment was typically 0.5 mm. The wafers were then cleaned in an ultrasonic bath of methanol followed by washing sequentially with chloroform, acetone and methanol.

The InP wafer was then placed with one of the large area (100) surfaces exposed at the deposition position of an ion sputtering apparatus equipped with a modified duoplasmatron as the source of the ion beam. (See E. G. Spencer and P. H. Schmidt, *J. Vac. Sci. Technol.* 8, S52 (1971); P. H. Schmidt, ibid. 10, 611 (1973) for a description of the apparatus.) The InP was outside the plasma environment and outside the line of the ion beam. The holder for the InP wafer was a molybdenum strip with provision for heating the sample. A target composed of 2% Zn in Au was inserted into the target position. The apparatus was evacuated to approximately $10^{-6}$ Torr. The filament in the ion source was brought to a temperature between 1500° and 2000° C and approximately a 1500 V potential was applied between the acceleration plates. Argon was bled into the ion source to raise the pressure to between $5 \times 10^{-5}$ Torr and $8 \times 10^{-5}$ Torr as measured at the throat of the chamber. The InP wafer was rotated about an axis perpendicular to the (100) plane (axis perpendicular to the exposed surface) at about 15 rpm to help insure uniform deposition. The deposition of the Au/Zn contact was allowed to continue until an approximately 2 $\mu$m layer had been deposited on the indium phosphide wafer. This took approximately 2 hours. The apparatus was vented and the InP removed. The wafer was then annealed on a carbon strip heater in forming gas (85% $N_2$ and 15% $H_2$) for 5 minutes. The contact obtained had a resistance of about 0.01 ohm for an area of 1 $cm^2$.

The indium phosphide wafer was replaced in the apparatus with the opposite surface of the contacted side exposed. The Au/Zn target was replaced with a target (4–5cm in diameter) composed of 90 mole % $In_2O_3$ and 10 mole % $SnO_2$. The apparatus was again evacuated to about $10^{-6}$ Torr and the ion source brought to the same conditions as when Au/Zn was being deposited. Oxygen was bled into the target chamber so that a pressure of about $1 \times 10^{-4}$ Torr was measured near the throat of the pump for the chamber. The InP was rotated at a rate of 15 rpm around an axis perpendicular to the (100) plane. No heat was applied to the InP. (It should be noted that if the oxygen pressure was significantly higher, the indium tin oxide layer obtained was much less conductive, and if significantly lower, the layer was opaque. A controlled sample is necessary to determine the appropriate pressure for a particular apparatus. It was also possible to do the deposition without oxygen present but this necessitates replacing the target after each run.) The indium tin oxide layer grew at a rate of about 0.7 $\mu$/hr. This rate was adjustable. If a potential is applied to the target, the rate was increased. The growth was continued until the layer was about 1-3 μm thick.

The chamber was vented and the sample removed. An aluminum strip about 1 mm wide was thermally evaporated by standard techniques onto the indium tin oxide parallel to one edge of the exposed metal oxide surface. The efficiency of the device, which had an amorphous metal oxide layer, was measured by two techniques described in a National Aeronautics and Space Administration (NASA) Memorandum numbered TMX-71771 and entitled "Interim Solar Cell Testing Procedures for Terrestrial Applications." The first set of measurements were made in N. J. sunlight by the pyranometer method. An Eppley Pyranometer Ser. No. 15228F3 that has a calibration constant of $9.39 \times 10^{-6}$ V/Vm$^{-2}$ was used to measure the incident solar power. The prepared device was mounted parallel to the pyranometer and the output of the device was compared directly to the pyranometer readings. Also, the inclination of the sun was measured. All electrical measurements were made with a Keithley 610 CR Electrometer. The short circuit current was measured by the voltage drop across a precision resistor of 10 Ω, for comparison measurements with 1 Ω and $\phi\Omega$ resistors were made. Only measurements resulting in less than 20 mV voltage drop were used. In view of the time of the year (winter) the temperature of the measurement was typically 10° C below the prescribed value. Measurements were performed in a second manner with a simulated light using a tungsten/halogen lamp with a Schott KG1 filter as a light source. The prepared device and a calibrated standard reference cell were mounted on a slider so that either the test device or the reference cell could be brought into the light beam without changing the distance to the lamp. The experimental conditions were set so that 74 mW/cm$^2$ was incident at the device. $V_{oc}$ and $I_{sc}$ were measured as in the pyranometer method. Also, in both methods I-V curves were recorded on a Tektronix 575 curve tracer and the fill factor was determined from the IV curves. The results of both methods agreed within 5% error limits. Efficiencies up to 12.5% were obtained for the prepared devices.

EXAMPLE 2

The same procedure was followed as described in Example 1, except the InP was heated to 250° C while the metal oxide layer was being deposited. A device with a polycrystalline metal oxide layer was obtained. Devices with efficiencies up to about 9% were measured by the techniques described in Example 1.

EXAMPLE 3

An InP polycrystalline wafer doped with ZnP$_2$ to a majority carrier concentration of $3 \times 10^{18}$cm$^{-3}$ was made by the gradient freeze method. (See K. J. Bachmann and E. Buehler *J. Electron Mater.* 3, 279 (1974).) The conditions were as specified in the above reference. The same fabrication procedure for completing the device was used as described in Example 1. The efficiency measured by the simulated light technique described in Example 1 was 2.3%.

EXAMPLE 4

A thin layer, 20 μ thick, of polycrystalline InP was deposited on a molded highly purified dense graphite substrate (type 5890PT, sold by Carbone - Lorraine Ind. Corp. Boonton, New Jersey) by a technique described by Bachmann et al in *J. Electrochem. Soc.*, 123, 1509 (1976). This chemical vapor deposition process comprises flowing palladium-diffused hydrogen through a bubbler containing phosphorus trichloride held at a temperature between 0 and 5° C. The flow rate of H$_2$ and the bubbler temperature were adjusted to produce a mole fraction of PCl$_3$ in H$_2$ of between 1 and 5%. The PCl$_3$ saturated H$_2$ is then flowed over elemental In heated to about 725° C. The H$_2$ flow finally is passed over the graphite substrate for deposition. A minor fraction of Zn dopant is added to the main gas flow upstream from the substrate by heating the Zn in a separate H$_2$ stream to about 455° C. The graphite substrate was heated to about 630° C. The same procedure, as in Example 1, was used to fabricate a device upon this InP. Electrical contact to the InP was made by applying silver paste to the carbon substrate. The efficiency of the device measured as in Example 1 by the simulated light technique was 1.1%.

EXAMPLE 5

The same procedure was followed as described in Example 1, except a single crystal of InP oriented along the (111) plane was used. The efficiency was 5%. The measuring technique was the same as the pyranometer method of Example 1 except an Eppley thermopile was used.

EXAMPLE 6

A single crystal of InP with a $1.5 \times 10^{17}$cm$^{-3}$ acceptor concentration was prepared, oriented parallel to the (100) plane, and contacted as described in Example 1. The crystal was then mounted in the sample holder of an Rf sputtering device. (Rf sputtering is a well-known technique described, for example, by J. L. Vossen in *Journal Vacuum Science and Technology*, 8 (5), S12, (1971).) A 6-inch diameter electrode of 91% In$_2$O$_3$ and 9% SnO$_2$ was mounted in the target holder. The chamber was evacuated and an atmosphere of 10 μm of 4.57 volume % CO, 0.23 volume % CO$_2$ and 95.2 volume % Ar was introduced. A potential of 700 V was impressed on the target. The InP was heated to 250° C. Approximately 850 watts was dissipated for deposition. The metal oxide was deposited at a rate of approximately 66 Angstroms/min until a film thickness of about 1.94 μm was obtained. After deposition contact was made to the metal oxide as described in Example 1. The efficiency measured by the simulated light technique described in Example 1 was 11%.

EXAMPLE 7

A device was prepared as described in Example 6 except the InP crystal was not heated during deposition. The film deposition rate was approximately 69 Angstroms/min. Deposition was continued until the metal oxide layer was 0.93 μm thick. The device had an efficiency measured by the simulated light technique described in Example 1 of about 12.2%.

EXAMPLE 8

An antireflection coating layer of MgF$_2$ was coated on the exposed surface of the indium tin oxide layer of the device prepared in Example 7. This layer was deposited by evaporation on the unheated device. A tungsten crucible was filled with MgF$_2$ and the device was suspended above the crucible with the indium tin oxide layer facing down toward the MgF$_2$. The crucible and device were put in a chamber which was evacuated to $10^{-6}$ Torr. The MgF$_2$ was then heated until evaporation of MgF$_2$ started. Evaporation was continued until a layer of approximately 1000 Angstroms was formed on the indium tin oxide. The efficiency measured by the technique described in Example 1 was 13%.

EXAMPLE

An antireflection coating layer of MgF$_2$ was coated on the exposed surface of the indium tin oxide layer of the device prepared in Example 4. This layer was deposited by evaporation (as in Example 8) on the unheated device. The efficiency measured by the simulated light technique described in Example 1 was about 2%.

What is claimed is:

1. A device comprising a p-type direct gap semiconductor material in intimate contact with a conducting transparent material characterized in that said conducting transparent material is chosen from the group consisting of indium oxide, and indium tin oxide, and said p-type direct gap semiconductor material is p-type InP whereby a rectifying junction is formed.

2. The device of claim 1 wherein said conducting transparent material is made by the technique of ion beam sputter deposition.

3. The device of claim 1 wherein said conducting transparent material is amorphous.

4. The device of claim 1 wherein said conducting transparent material is polycrystalline.

5. The device of claim 1 wherein said p-type InP is polycrystalline.

6. The device of claim 1 including an antireflection coating deposited on said conducting transparent material.

7. The device of claim 1 wherein said p-type InP layer is a single crystal of InP.

8. The device of claim 7 wherein said conducting transparent material is in intimate contact with the 100 plane of said single crystal of InP.

9. The device of claim 1 wherein said conducting transparent material is made by the technique of Rf sputtering.

10. A device comprising a conducting transparent material deposited on a p-type direct gap semiconductor material CHARACTERIZED IN THAT said conducting transparent material is chosen from the group consisting of indium oxide and indium tin oxide and said p-type direct gap semiconductor material is p-type InP whereby a rectifying junction is formed.

* * * * *

UNITED STATES PATENT AND TRADEMARK OFFICE
CERTIFICATE OF CORRECTION

PATENT NO. : 4,121,238

DATED : October 17, 1978

INVENTOR(S) : Klaus J. Bachmann, Paul H. Schmidt, Edward G. Spencer, and Karnamadakala S. Sree Harsha It is certified that error appears in the above—identified patent and that said Letters Patent is hereby corrected as shown below:

Column 5, line 16, "V/Vm$^{-2}$" should read --V/Wm$^{-2}$--.
Column 5, line 24, "$\phi\Omega$" should read --100 $\Omega$--. Column 7, line 6, "EXAMPLE" should read --EXAMPLE 9--.

Signed and Sealed this

Nineteenth Day of May 1981

[SEAL]

*Attest:*

RENE D. TEGTMEYER

*Attesting Officer*     *Acting Commissioner of Patents and Trademarks*